United States Patent [19]

Draheim et al.

[11] 4,398,146

[45] Aug. 9, 1983

[54] TEST CIRCUIT FOR MOS DEVICES

[75] Inventors: Peter Draheim; Friedrich Hapke, both of Hamburg, Fed. Rep. of Germany

[73] Assignee: U.S. Philips Corporation, New York, N.Y.

[21] Appl. No.: 196,232

[22] Filed: Oct. 14, 1980

[30] Foreign Application Priority Data

Nov. 2, 1979 [DE] Fed. Rep. of Germany ....... 2944149

[51] Int. Cl.³ ............................................ G01R 15/12
[52] U.S. Cl. ................................ 324/73 R; 324/73 PC
[58] Field of Search .......................... 324/73 R, 73 PC

[56] References Cited

U.S. PATENT DOCUMENTS 3,772,595 11/1973 De Wolf ............................ 324/73 R
4,339,710 7/1982 Hapke ................................ 324/73 R Primary Examiner—Michael J. Tokar
Attorney, Agent, or Firm—Thomas A. Briody; Robert T. Mayer; Steven R. Biren

[57] ABSTRACT

A test circuit for use in an MOS device includes two inputs, a first input which is responsive to a test signal of opposite polarity to that of the supply voltage, and a second input which is responsive to a test signal of the same polarity as that of the supply voltage but of a substantially higher magnitude than that of the supply voltage. The test circuit is enabled only when both the opposite polarity signal on the first input and the higher magnitude signal on the second input occur. In this manner a substantial immunity to spurious voltage transients of either polarity is obtained while permitting the test circuit and the circuits on the same MOS device being tested to share common terminals.

3 Claims, 2 Drawing Figures

TEST CIRCUIT FOR MOS DEVICES

BACKGROUND OF THE INVENTION

The invention relates to a test circuit equipped with MOS transistors and accommodated on a single substrate together with at least one further MOS-circuit, which test circuit comprises one or more test terinals, which may be combined with terminals of the further circuit nd by means of which one or more test signals of a polarity opposite to that of the normal supply voltage can be applied, the further circuit then supplying monitoring signals which are indicative of the correst or incorrect operation of the further circuit, thereby enabling part or all of said further circuit to be tested.

As already stated in German Patent Application No. P 29 05 294.6, it is necessary, as the degree of integration and thus the complexity of integrated circuits increases, to test the integrated circuit during fabrication by so-called pre-testing and after fabrication by so-called final testing, in order to obtain better detection of any defects in fabrication.

However, as the degree of integration increases the number of external connections can not be increased to the same extent, so that it becomes more and more difficult to test such circuits. A test circuit which is designed to accept test signals of a polarity opposed to that of the normal supply voltage of the integrated circuit is known from German Patent Application No. P 29 05 294.6.

As a result of mismatches at the individual terminals of the IC, as is apparent from experimental results, it may happen that during normal operation of the circuit voltage transients of a polarity opposite to that of the normal supply voltage are produced, so that the test circuit in accordance with the previous Patent Application No. P 29 05 294.6 is turned on inadvertently during normal operation. It is obvious that such a changeover to the so-called test mode leads to incorrect operation of the circuitry during normal operation and may result in failure of the complete system in which such a device is included.

SUMMARY OF THE INVENTION

It is an object of the invention to provide a test circuit in MOS technology which together with a further circuit can be accommodated on a single substrate and which during normal opertion of the further circuit is immune to spurious voltage transients on its test connections, even to those of a polarity opposite to that of the normal supply voltage, regardless of whether said test terminals are combined with input or output terminals of the further circuit, which test circuit is therefore characterized in that it comprises a first gate circuit having an output and a first and a second input, the first input being coupled to one of the test terminals, and the second input accepting a test signal of the same polarity as that of the normal supply voltage but of an amplitude which is substantially higher than that of said supply voltage, by means of which the test terminals can be rendered responsive to test signals of a polarity opposite to that of the normal supply voltage.

By including the first gate circuit in that test circuit in accordance with the invention, which gate circuit, under control of an additional test signal of the same polarity as the normal supply voltage but of substantially higher amplitude which is applied to the second input, renders the test terminals responsive to test signals only when this is required, it is ensured that the circuit cannot inadvertently be set to the test mode. The use of two test signals for the first gate circuit is an additional precaution against inadvertent selection of the test mode.

A preferred embodiment of a test circuit in accordance with the invention is characterized in that the first gate circuit comprises a first, a second and a third FET of the depletion type and a fourth, fifth, sixth and seventh FET of the enhancement type, the first FET:
  having its gate coupled to the first input, and
  having its source coupled to ground;
the second FET
  having its gate and its source interconnected and coupled to the drain of the first FET, and
  having its drain coupled to the supply voltage;
the fifth FET
  having its gate coupled to the second input, and
  having its drain coupled to the supply voltage;
the sixth FET
  having its gate coupled to the supply voltage,
  having its source coupled to earth, and
  having its drain coupled to the source of the fifth FET;
the seventh FET
  having its gate coupled to the drain of the sixth FET, and
  having its source coupled to earth;
the fouth FET
  having its gate coupled to the drain of the first FET, and
  having its source coupled to the drain of the seventh FET, and
the third FET
  having its gate and its source coupled to the drain of the fourth FET and to the output, and
  having its drain coupled to the supply voltage.

The test terminals may for example be blocked to test signals by having the signal transfer from the test terminals to the relevant points of the further circuit take place via further gate circuits, which can be turned on and turned off by the output signal of the first gate circuit.

The described arrangement of the first gate circuit in accordance with the invention provides the desired switching function, namely: a "low" output signal when the voltage on the first input is lower than approximately $-3$ V and, moreover, the voltage on the second input is substantially higher than the normal supply voltage.

A further preferred embodiment of a test circuit in accordance with the invention is characterized in that it comprises one or more so-called latch circuits, which each comprise a signal input, an enable input and one pair of outputs, as well as a so-called 1-out-of $2^n$ decoder, the signal inputs of the latch circuits each being coupled to one of the test terminals, the outputs of the latch circuits each being coupled to one of the inputs of the 1-out-of $2^n$ decoder, the enable inputs of the latch circuits being coupled to the output of the first gate circuit, and the outputs of the 1-out-of $2^n$ decoder each being coupled to points of the further circuits to which test signals are to be applied.

The said latch circuits may for example have the following property: when the enable input goes from "high" to "low", the information then appearing at the signal input ("0" or "1") is transferred to the output, where it is retained until the enable input becomes "high" again. When an enable input is "high" the output is always "low".

The circuit arrangement of this preferred embodiment of the test circuit in accordance with the invention enables $2^n$ different test modes to be realized by means of $n+1$ test terminals and the second input of the first gate circuit, the latch circuits serving to retain a specific pattern of test signals being applied. This pattern can only be changed if the enable signal on the output of the first gate circuit becomes "high" and subsequently "low" again, so that the pattern being retained is not affected by spurious voltage transients on the test terminals.

BRIEF DESCRIPTION OF THE DRAWINGS

The invention will be described in more detail with reference to the Figures, in which.

DETAILED DESCRIPTION

Figure 1:
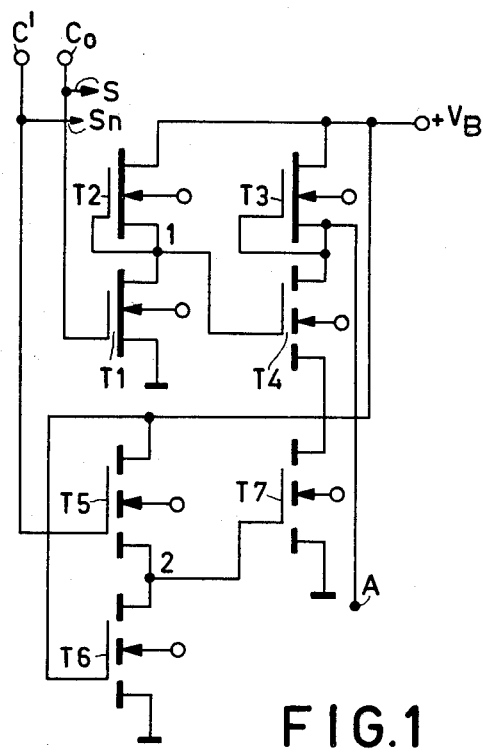
FIG. 1 represents the circuit diagram of a preferred embodiment of the first gate circuit of a test circuit in accordance with the invention.

FIG. 1 represents the circuit diagram of a preferred embodiment of the first gate circuit of a test circuit in accordance with the invention, employing three MOD-field-effect transistors of the depletion type, the FET's T1, T2 and T3, and four MOS-field-effect transistors of the enhancement type, the FET's T4, T5, T6 and T7.

FET T1 has its gate coupled to the first input, which is constituted by the test terminal Co, and has its source coupled to ground.

FET 72 has its gate and source interconnected and coupled to the drain of FET T1, and has its drain coupled to the $+V_B$ supply voltage, FET T5 has its gate coupled to the second input C', and has its drain coupled to the $+V_B$ supply voltage, FET T6 has its gate coupled to the $+V_B$ supply voltage, has its source coupled to ground, and has its drain coupled to the source of FET T5, FET T7 has its gate coupled to the drain of FET T6, and has its source coupled to ground, FET T4 has its gate coupled to the drain of FET T1, and has its source coupled to the drain of FET T7, and FET T3 has its gate and source coupled to the drain of FET T4 and to the output A, and has its drain coupled to the $+V_B$ supply voltage.

It is to be noted that in the accompanying drawing $+V_B$ is the operating voltage.

Input C' need not be a special terminal of the IC, but may be a terminal which is also required for the normal mode of operation. However, now this terminal accepts test signals having a substantially higher amplitude than, but the same polarity as the normal supply voltage. The circuit will be set to the test mode only if test signals of a polarity opposed to that of the normal supply voltage of the integrated circuit are applied to input Co and if at the same time test signals having the same polarity as the normal supply voltage but a substantially higher amplitude than the normal supply voltage are applied to input C'. The circuit in accordance with the invention operates as follows:

If at a supply voltage of $+5$ V a positive signal of approximately $+12$ V is applied to input C', the internal connection point 2 goes from the LOW stage (approximately 0 V) to the HIGH state (for example higher than 2.5 V). The drain-source resistance of FET T5 is then lower than the drain-source resistance of FET T6, so that connection point 2 will be at a voltage higher than $+2.5$ V. In the other case, when a signal between 0 and $+5$ V is applied to input C', the drain-source resistance of FET T5 is higher than the drain-source resistance of FET T6, so that the voltage on connection point 2 becomes approximately 0 V.

The internal connection point 1 then becomes HIGH only if a negative lower than $-3$ V is applied to input $C_o$. Thus, the connection points 1 and 2 become HIGH only if a negative signal lower than approximately $-3$ V appears on input Co and at the same time a large positive signal of approximately $+12$ V appears on input C', so that the FET's T4 and T7 are turned on and the output A of the first gate circuit becomes LOW, i.e. approximately 0 V. If one of the two inputs Co or C' does not meet these requirements, output A of the first gate circuit will be HIGH or approximately $+5$ V.

Figure 2:
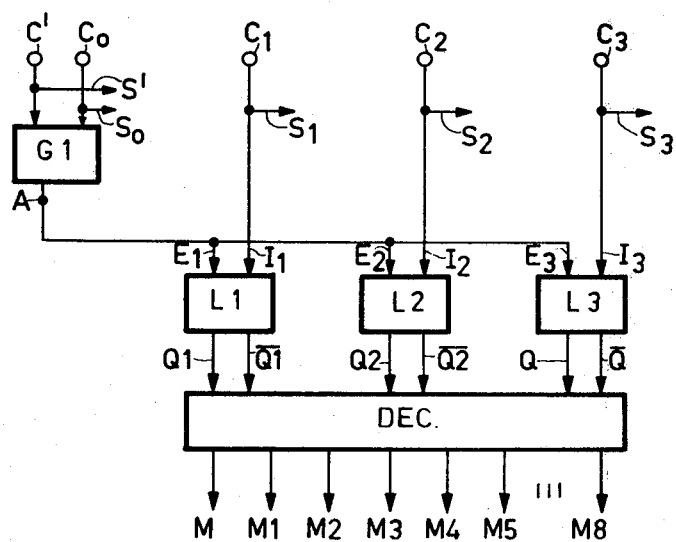
FIG. 2 represents the block diagram of a preferred embodiment of a test circuit in accordance with the invention.

FIG. 2 represents a block diagram of a preferred embodiment of a test circuit in accordance with the invention, showing:

a first gate circuit designated G1 with two inputs Co and C' and an output A as in FIG. 1, three latch circuits (i.e. $n=3$ in the present example), designated L 1, L 2 and L 3, each having a signal input $I_1$, $I_2$ and $I_3$ respectively, an enable input E1, E2 and E3 respectively, and output pairs Q1 and $\overline{Q1}$; Q2 and $\overline{Q2}$; and Q3 and $\overline{Q3}$ respectively.

The test terminals to which the test signals of a polarity opposite to that of the normal supply voltage can be applied are designated $C_0$, $C_1$ and $C_2$ and $C_3$. These terminals may also be used as terminals for the further circuit (to be tested). The connections between the test terminals and the further circuit are now designated $S_0$, $S_1$, $S_2$ and $S_3$. The test terminal $C_0$ constitutes the first input of the first gate circuit, while the test terminals $C_1$, $C_2$ and $C_3$ are respectively connected to signal inputs $I_1$, $I_2$ and $I_3$ of the associated latch circuits.

The second input of the first gate circuit is coupled to the terminal C', to which a test signal may be applied having the same polarity as the supply voltage but having a substantially higher amplitude and to which, as the case may be, via the connection S' a suitable point of the further circuit may be coupled, so that the terminal S' may also be used as a terminal for the further circuit. The outputs of the latch circuits Q1, $\overline{Q1}$, Q2, $\overline{Q2}$, and Q3, $\overline{Q3}$ are coupled to the inputs of the 1-out-of-$2^3$ decoder DEC. (not further shown). The outputs of the 1-out-of-$2^n$ decoder, in the present example the eight outputs M1 to M8, are coupled to the points of the further circuit (to be tested) to which test signals are to be applied.

If the signal on point A is LOW, i.e. approximately 0 V, the latch circuits can be set via the test terminals $I_1$, $I_2$, $I_3$. The logic states of the latches are maintained until they are reset by the first gate circuit. Thus, if the signal on point A is HIGH, i.e. approximately $+5$ V, the latch circuits cannot be set via the test terminals $I_1$, $I_2$, $I_3$ and if they were set, they will be reset. In this case the outputs $Q_1$, $Q_2$ and $Q_3$ of the latch circuits will become LOW, i.e. approximately 0 V, which means that the outputs $M_1$ to $M_8$ of the decoder are HIGH and the circuit is in the normal mode of operation. However, if the signal on point A is LOW and a test mode is selected via the test terminals, one of the decoder outputs becomes LOW and the other seven decoder ouputs become HIGH, which means that one of the test modes is obtained, so that the circuit will operate in this test mode.

What is claimed is:

1. A test circuit having MOS transistors and accommodated on a substrate together with at least one further MOS-circuit, which test circuit comprises at least one test terminal, which test terminal is capable of being combined with terminals of the further circuit and by means of which one or more test signals of a polarity opposite to that of the normal supply voltage are selectively applied, the further circuit then supplying signals which are indicative of the operation of the further circuit, thereby enabling said further circuit to be tested, said test circuit comprising a first gate circuit having an output and a first and a second input, the first input being coupled to one test terminal and the second input receiving a test signal of the same polarity as that of the supply voltage but of an amplitude which is substantially higher than that of said supply voltage, by means of which the test circuit is rendered responsive to test signals of a polarity opposite to that of the normal supply voltage on said first input terminal.

2. A test circuit as claimed in claim 1, characterized in that the first gate circuit comprises a first, a second and a third FET of the depletion type, and a fourth, a fifth, a sixth and a seventh FET of the enhancement type:

the first FET having its gate coupled to the first input, and having its source coupled to ground;

the second FET having its gate and source interconnected and coupled to the drain of the first FET, and having its drain coupled to the supply voltage;

the fifth FET having its gate coupled to the second input, and having its drain coupled to the supply voltage;

the sixth FET having its gate coupled to the supply voltage, having its source coupled to ground, and having its drain to the source of the fifth FET;

the seventh FET having its gate coupled to the drain of the sixth FET, and having its source coupled to ground;

the fourth FET having its gate coupled to the drain of the first FET, and having its source coupled to the drain of the seventh FET; and the third FET having its gate and its source interconnected and coupled to the drain of the fourth FET and to the output, and having its drain coupled to the supply voltage.

3. A test circuit as claimed in claim 1 or 2, further comprising one or more latch circuits, each of which comprise a signal input, an enable input, and a pair of outputs, and a 1-out-of-$2^n$ decoder;

the signal inputs of the latch circuits each being coupled to one of the test terminals;

the outputs of the latch circuits each being coupled to one of the outputs of the 1-out-of-$2^n$ decoder;

the enable inputs of the latch circuits being coupled to the output of the first gate circuit; and the outputs of the 1-out-of-$2^n$ decoder each being coupled to points of the further circuit to which test signals are to be applied.

* * * * *